(12) United States Patent
Ikeda et al.

(10) Patent No.: US 11,600,475 B2
(45) Date of Patent: Mar. 7, 2023

(54) PLASMA PROCESSING APPARATUS AND CONTROL METHOD

(71) Applicant: TOKYO ELECTRON LIMITED, Tokyo (JP)

(72) Inventors: Taro Ikeda, Nirasaki (JP); Mikio Sato, Nirasaki (JP); Eiki Kamata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 117 days.

(21) Appl. No.: 16/942,145

(22) Filed: Jul. 29, 2020

(65) Prior Publication Data

US 2021/0035787 A1 Feb. 4, 2021

(30) Foreign Application Priority Data

Aug. 1, 2019 (JP) .............................. JP2019-142193

(51) Int. Cl.
*H01J 37/32* (2006.01)

(52) U.S. Cl.
CPC ..... *H01J 37/32935* (2013.01); *H01J 37/3211* (2013.01); *H01J 37/32119* (2013.01); *H01J 2237/24564* (2013.01)

(58) Field of Classification Search
CPC ............. H01J 37/32935; H01J 37/3211; H01J 37/32119; H01J 2237/24565
See application file for complete search history.

(56) References Cited

U.S. PATENT DOCUMENTS

| | | | | |
|---|---|---|---|---|
| 2010/0175831 | A1* | 7/2010 | Sasaki | C23C 16/505 156/345.48 |
| 2016/0048111 | A1* | 2/2016 | Wong | H01J 37/32935 700/109 |

FOREIGN PATENT DOCUMENTS

| | | | |
|---|---|---|---|
| JP | 2015-015342 | A | 1/2015 |
| JP | 2017-079127 | A | 4/2017 |
| KR | 10-2015-0005450 | A | 1/2015 |
| KR | 10-2018-0116143 | A | 10/2018 |

* cited by examiner

*Primary Examiner* — Binh X Tran
(74) *Attorney, Agent, or Firm* — Fenwick & West LLP

(57) ABSTRACT

A plasma processing apparatus includes a main container, one or more radio frequency antennas, a plurality of metal windows, and a plasma detector. The one or more radio frequency antennas are configured to generate inductively coupled plasma in a plasma generation region in the main container. The metal windows are disposed between the plasma generation region and the radio frequency antennas while being insulated from each other and from the main container. Further, a plasma detector is connected to each of the metal windows and configured to detect a plasma state.

11 Claims, 4 Drawing Sheets

PLASMA PROCESSING APPARATUS AND CONTROL METHOD

CROSS-REFERENCE TO RELATED APPLICATION

This application claims priority to Japanese Patent Application No. 2019-142193, filed on Aug. 1, 2019, the entire contents of which are incorporated herein by reference.

TECHNICAL FIELD

The present disclosure relates to a plasma processing apparatus and a control method.

BACKGROUND

There is known an inductively coupled plasma processing apparatus using a metal window (see, e.g., Japanese Patent Application Publication No. 2015-15342).

The present disclosure provides a technique capable of monitoring a plasma state in an inductively coupled plasma processing apparatus using a metal window.

SUMMARY

In accordance with an aspect of the present disclosure, there is provided a plasma processing apparatus including: a main container; one or more radio frequency antennas configured to generate inductively coupled plasma in a plasma generation region in the main container; a plurality of metal windows disposed between the plasma generation region and the radio frequency antennas while being insulated from each other and from the main container; and a plasma detector connected to each of the metal windows and configured to detect a plasma state.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
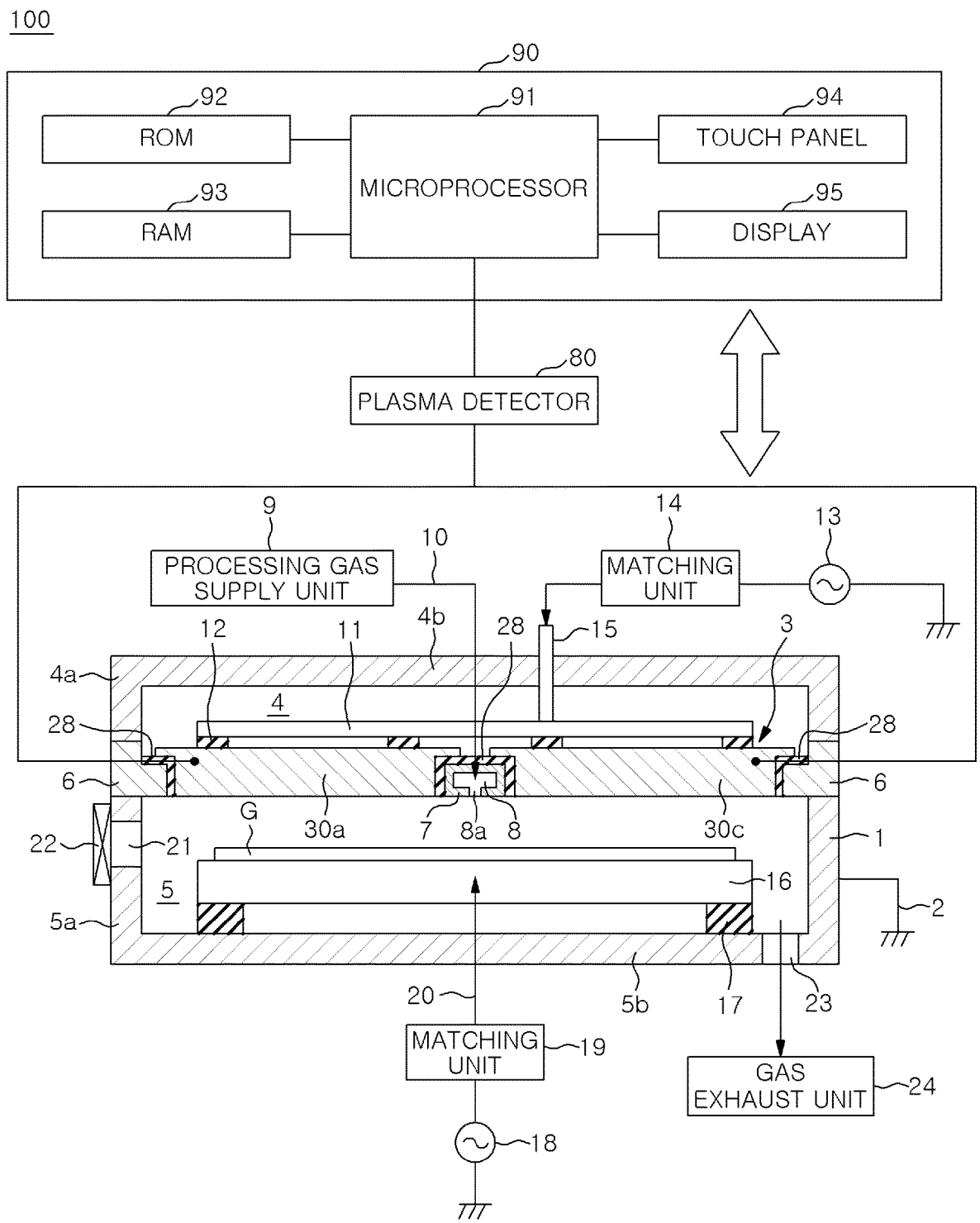
FIG. 1 is a cross-sectional view schematically showing an inductively coupled plasma processing apparatus according to an embodiment.

Hereinafter, embodiments of the present disclosure that are not restrictive but illustrative will be described in detail with reference to the accompanying drawings. Like reference numerals will be given to like or corresponding parts throughout the drawings and redundant description thereof will be omitted.

(Plasma Processing Apparatus)

FIG. 1 is a cross-sectional view schematically showing an inductively coupled plasma processing apparatus according to an embodiment. A plasma processing apparatus 100 can be used to perform a plasma process such as ashing of a resist film or etching of an oxide film, an indium tin oxide (ITO) film, a metal film used in the case of forming a thin film transistor on a glass substrate for use in a flat panel display (FPD). The FPD is, e.g., a liquid crystal display (LCD), an electroluminescence (EL) display, a plasma display panel (PDP) and the like. Further, the plasma processing apparatus 100 can also be used not only for the plasma process performed on the glass substrate for use in the FPD but also for various plasma processes performed on a glass substrate for use in a solar cell panel, a semiconductor wafer and the like during each manufacturing process thereof.

The plasma processing apparatus 100 includes an airtight main container 1 having a rectangular housing shape. The main container 1 is made of a conductive material, e.g., aluminum whose inner surface is anodically oxidized to form an anodically oxidized film thereon. The main container 1 is grounded through a ground line 2. An inner space of the main container 1 is horizontally partitioned by a metal window 3 into an antenna chamber 4 as an upper space and a processing chamber 5 as a lower space.

The metal window 3 includes a supporting bracket 6, a supporting beam 7, and metal windows 30a to 30d. The supporting bracket 6 and the supporting beam 7 are disposed between a sidewall 4a of the antenna chamber 4 and a sidewall 5a of the processing chamber 5 in the main container to project toward the inner space of the main container 1. The metal windows 30a to 30d are mounted on the supporting bracket 6 and the supporting beam 7 while being electrically insulated from each other by insulators 28.

The metal windows 30a to 30d occupy most of the metal window 3 serving as a ceiling wall of the processing chamber 5. Each of the metal windows 30a to 30d has a rectangular shape. The metal windows 30a to 30d are made of a nonmagnetic metal such as aluminum, aluminum alloy, or the like. When the metal windows 30a to 30d are made of aluminum or aluminum alloy, it is preferred to form an anodically oxidized film or a thermally sprayed ceramic film, or a ceramic or quartz cover at least on the surfaces (bottom surfaces) of the metal windows 30a to 30d on the processing chamber 5 side in order to improve corrosion resistance.

A plasma detector 80 configured to detect a plasma state is connected to the metal windows 30a to 30d. The plasma detector 80 is configured to detect a plasma state by measuring each current flowing through the metal windows 30a to 30d when an AC voltage is applied to the metal windows 30a to 30d. The plasma detector 80 will be described in detail later.

The supporting bracket 6 and the supporting beam 7 are made of a conductive material, e.g., a nonmagnetic metal such as aluminum or the like, and are electrically connected to the main container 1. The insulators 28 are electrical insulators, e.g., ceramic, quartz, or polytetrafluoroethylene (PTFE). In the plasma processing apparatus 100, the supporting beam 7 serves as a shower housing for supplying a processing gas, and a gas flow path 8 extending in a direction parallel to a processing target surface of the substrate G is formed in the supporting beam 7. The gas flow path 8 has a plurality of gas injection holes 8a through which the processing gas is injected into the processing chamber 5. The processing gas is supplied from a processing gas supply unit 9 to the gas flow path 8 through a gas supply line 10, and then is injected into the processing chamber 5 through the gas injection holes 8a. The processing gas may be supplied from the metal windows 30a to 30d in the case where the metal windows 30a to 30d serve as a shower head.

In the antenna chamber 4 formed above the metal window 3, a radio frequency antenna 11 is disposed to face the metal windows 30a to 30d. The radio frequency antenna 11 is spaced apart from the metal windows 30a to 30d at a regular interval via a spacer 12 made of an insulating member. A first radio frequency power supply 13 is connected to the radio frequency antenna 11 through a matching unit 14 and a power feed line 15. During the plasma process, a radio frequency power for generating an inductive electric field is applied to the radio frequency antenna 11. A frequency of the radio frequency power is, e.g., 13.56 MHz.

By applying the radio frequency power to the radio frequency antenna 11, inductively coupled plasma is generated in a plasma generation region in the main container 1. More specifically, when the radio frequency power is supplied to the radio frequency antenna 11, eddy currents are induced in the metal windows 30a to 30d and the inductive electric field is generated in the plasma generation region in the processing chamber 5 by the eddy currents. Then, the processing gas supplied through the gas injection holes 8a is turned into plasma in the plasma generation region in the processing chamber 5 by the generated inductive electric field.

In the processing chamber 5, a substrate support 16 on which the substrate G is to be placed is disposed to face the metal windows 30a to 30d while being electrically insulated from the main container 1 by an insulating member 17. The substrate support 16 is made of a conductive material, e.g., aluminum, and has an anodically oxidized surface. The substrate support 16 is provided with an electrostatic chuck (not shown). The substrate G is attracted to and held on the substrate support 16 by the electrostatic chuck.

A second radio frequency power supply 18 is connected to the substrate support 16 through a matching unit 19 and a power feed line 20, and a radio frequency bias power is applied to the substrate support 16 during the plasma process. A frequency of the radio frequency power is, e.g., 3.2 MHz. By applying the radio frequency bias power to the substrate support 16, ions in the plasma generated in the processing chamber 5 can be effectively attracted to the substrate G.

In order to control the temperature of the substrate G, the substrate support 16 is provided with a temperature sensor and a temperature control mechanism including a coolant flow path, a heating unit such as a ceramic heater or the like. Further, the substrate G is not necessarily supported by the substrate support 16. When the supply of the radio frequency bias power or the temperature control mechanism is not required, the substrate G may be supported by pins or rod-shaped members projecting from a bottom portion or a side portion, or may be supported by a pick of a transfer unit or the like.

A loading/unloading port 21 for loading and unloading the substrate G into and from the processing chamber 5 is disposed on the sidewall 5a of the processing chamber 5. The loading/unloading port 21 is opened and closed by a gate valve 22. A gas exhaust port 23 for exhausting a gas in the processing chamber 5 is disposed on a bottom wall 5b of the processing chamber 5. A gas exhaust unit 24 including a vacuum pump or the like is connected to the gas exhaust port 23. The inner space of the processing chamber 5 is exhausted by the gas exhaust unit 24, and a pressure in the processing chamber 5 is set and maintained in a predetermined vacuum atmosphere (e.g., 1.33 Pa) during the plasma process.

The respective components of the plasma processing apparatus 100 are controlled by a controller 90. The controller 90 includes a microprocessor 91, a read only memory (ROM) 92, and a random access memory (RAM) 93. The ROM 92 and the RAM 93 store a process sequence and a process recipe that is a control parameter of the plasma processing apparatus 100. The microprocessor 91 controls the respective components of the plasma processing apparatus 100 based on the process sequence and the process recipe. Further, the controller 90 includes a touch panel 94 and a display 95 so that it is possible to input commands or display results at the time of performing a predetermined control based on the process sequence and the process recipe.

When the plasma processing is performed in the plasma processing apparatus 100, first, the substrate G held by a transfer arm (not shown) is loaded into the processing chamber 5 through the loading/unloading port 21 by opening the gate valve 22. The gate valve 22 is closed after the substrate G is loaded. When the substrate G is transferred to a position above the substrate support 16, the substrate G is transferred from the transfer arm to supporting pins (not shown) and mounted on the substrate support 16 by lowering the supporting pins. The pressure in the processing chamber 5 is maintained at a predetermined vacuum level by the gas exhaust unit 24. Then, the processing gas is supplied from the processing gas supply unit 9 to the gas flow path 8 through the gas supply line 10 and introduced into the processing chamber 5 through the gas injection holes 8a. Eddy currents are induced in the metal windows 30a to 30d by the radio frequency power for generating the inductive electric field supplied from the first radio frequency power supply 13 to the radio frequency antenna 11 through the matching unit 14 and the power feed line 15. Thus, the inductive electric field is generated in the plasma generation region in the processing chamber 5 by the eddy currents. Then, the processing gas supplied from the gas injection holes 8a is turned into plasma in the plasma generation region in the processing chamber 5 by the inductive electric field, and the plasma process is performed on the substrate G.

(Plasma Detector)

Figure 2:
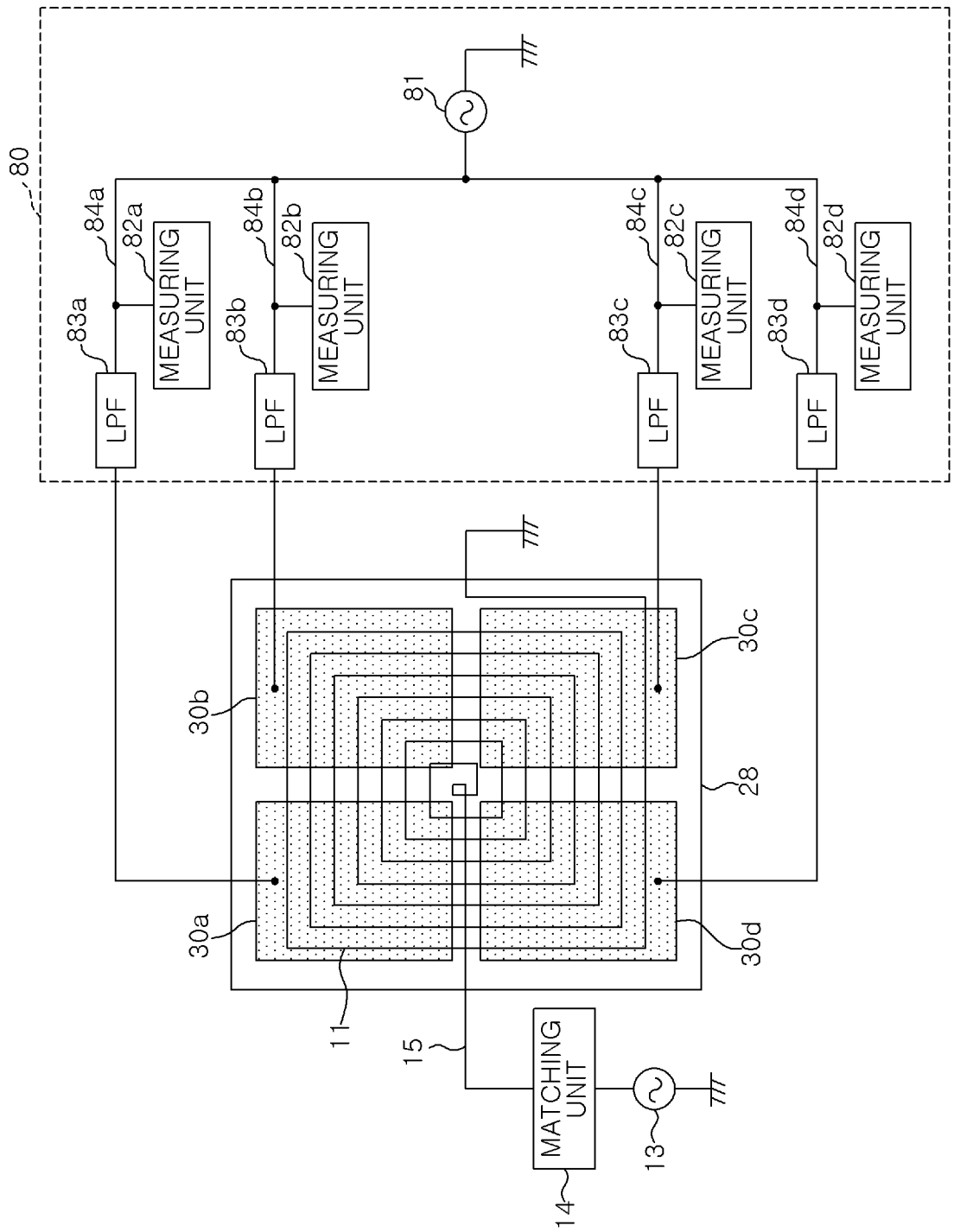
FIG. 2 shows a configuration of the plasma processing apparatus for explaining a plasma detector of the plasma processing apparatus shown in FIG. 1.

FIG. 2 is a schematic plan view of the radio frequency antenna 11 and the metal windows 30a to 30d for explaining a plasma detector 80 of the plasma processing apparatus 100 shown in FIG. 1. The plasma detector 80 is configured to detect a plasma state by measuring each of the currents flowing through the metal windows 30a to 30d when an AC voltage is applied to the metal windows 30a to 30d.

The plasma detector 80 includes an AC power supply 81, measuring units 82a to 82d, and low pass filters 83a to 83d.

The AC power supply 81 is connected to the metal windows 30a to 30d respectively through power feed lines 84a to 84d. The AC power supply 81 applies an AC voltage to the metal windows 30a to 30d through the power feed lines 84a to 84d under the control of the controller 90. The AC voltage has a voltage value of, e.g., several V, and a frequency of, e.g., several tens of kHz. Although FIG. 2 shows a case where one AC power supply 81 is provided for the four metal windows 30a to 30d, the present disclosure is not limited thereto. For example, one AC power supply 81 may be provided for each of the metal windows 30a to 30d.

The measuring units 82a to 82d are disposed to correspond to the metal windows 30a to 30d, respectively. When the AC voltage is applied to the metal windows 30a to 30d from the AC power supply 81 through the power feed lines 84a to 84d, the measuring units 82a to 82d respectively measure the currents flowing through the metal windows 30a to 30d during the plasma process via the power feed lines 84a to 84d.

The low pass filters 83a to 83d are disposed in the power feed lines 84a to 84d, respectively. The low pass filters 83a to 83d are respectively configured to remove unnecessary radio frequency components of AC currents flowing through the power feed lines 84a to 84d in order to prevent unnecessary harmonic components from flowing into the measuring units 82a to 82d through the power feed lines 84a to 84d. Further, a capacitor may be disposed in each of the power feed lines 84a to 84d.

In the plasma detector 80, when the AC voltage is applied from the AC power supply 81 to the metal windows 30a to 30d under the control of the controller 90, the measuring units 82a to 82d respectively measure the currents flowing through the metal windows 30a to 30d during the plasma process via the power feed lines 84a to 84d. The currents flowing through the metal windows 30a to 30d are equivalent to the current flowing through the plasma generated in the processing chamber 5. Therefore, the state of the plasma generated in the processing chamber 5 can be detected by measuring the currents flowing through the metal windows 30a to 30d during the plasma process.

The measuring units 82a to 82d respectively transmit signals indicating waveforms of the measured currents to the controller 90. When the signals are received, the microprocessor 91 of the controller 90 obtains the plasma state by Fourier transforming and analyzing each of the waveforms of the currents included in the signals. The plasma state includes, e.g., an electron density Ne and an electron temperature Te. Accordingly, the plasma state below each of the four metal windows 30a to 30d can be monitored in real time. As a result, it is possible to detect temporal changes of the plasma state or variation in the in-plane distribution of the plasma during the plasma process.

The microprocessor 91 corrects apparatus parameters of the plasma processing apparatus 100 depending on the plasma state (e.g., the plasma electron density Ne, the electron temperature Te, and the like) obtained based on each of the measurement results of the measuring units 82a to 82d. Accordingly, it is possible to adjust the temporal changes of the plasma state or the in-plane distribution of the plasma generated in the processing chamber 5. Here, the apparatus parameters include, e.g., an output (radio frequency power) or a frequency of the first radio frequency power supply 13, and a pressure in the processing chamber 5.

Figure 3:
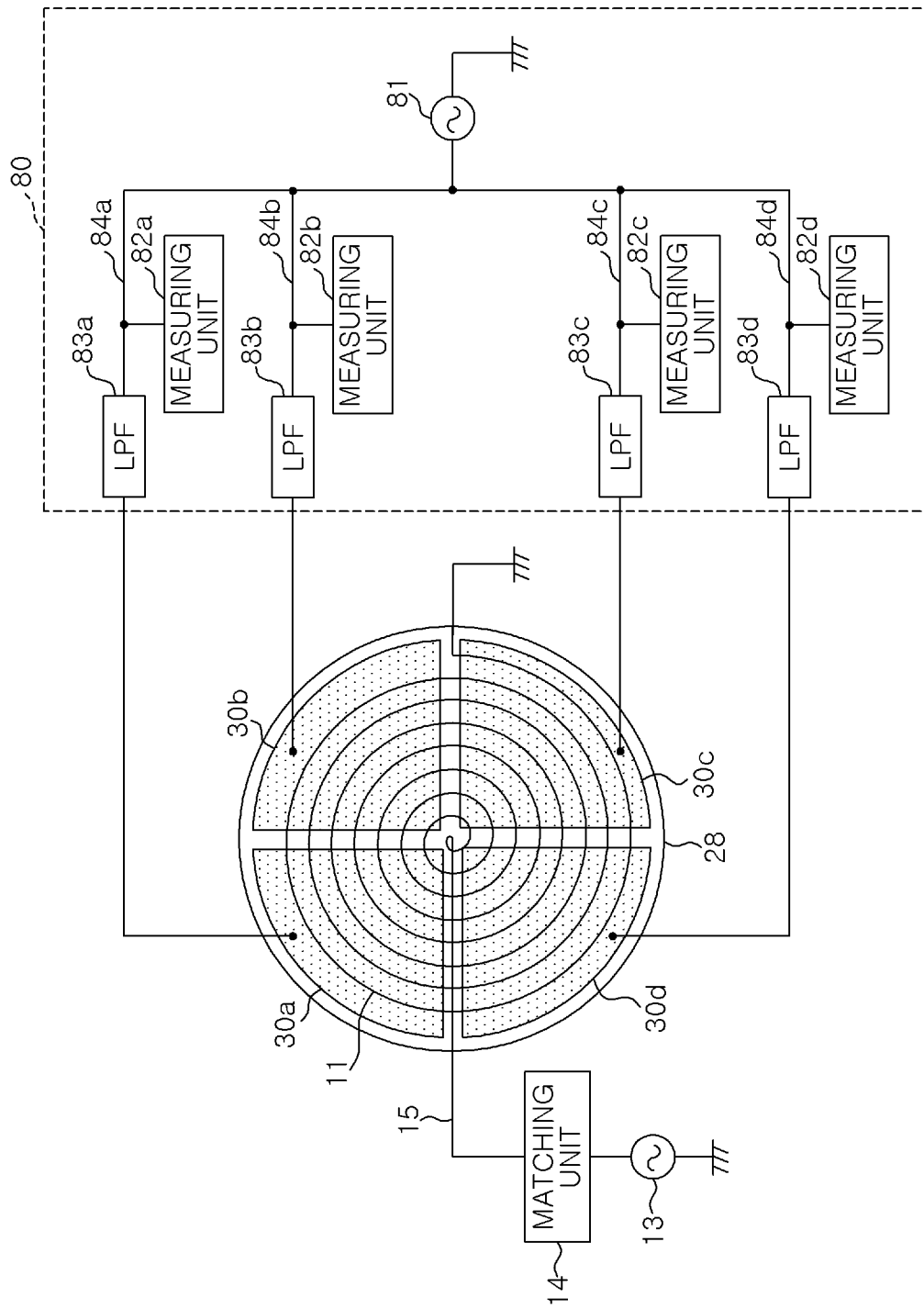
FIG. 3 shows another example of the plasma processing apparatus.

FIG. 3 shows another example of the plasma processing apparatus and is a schematic plan view of the radio frequency antenna and the metal windows. In the plasma processing apparatus shown in FIG. 3, the main container 1 is a cylindrical airtight container, and each of the metal windows 30a to 30d is formed in a fan shape (e.g., quarter circle shape) having a central angle of 90 degrees.

In the plasma processing apparatus shown in FIG. 3 as well as the above-described plasma processing apparatus 100, the plasma detector 80 detects the plasma state by measuring each of the currents flowing through the metal windows 30a to 30d when an AC voltage is applied to the metal windows 30a to 30d. Accordingly, the distribution state of the plasma in the circumferential direction below the four metal windows 30a to 30d can be monitored. Specifically, when the AC voltage is applied from the AC power supply 81 to the metal windows 30a to 30d under the control of the controller 90, the measuring units 82a to 82d respectively measure the currents flowing through the metal windows 30a to 30d during the plasma process via the power feed lines 84a to 84d. The measuring units 82a to 82d respectively transmit signals indicating waveforms of the measured currents to the controller 90. When the signals are received, the microprocessor 91 of the controller 90 obtains the plasma state by Fourier transforming and analyzing each of the waveforms of the currents contained in the signals. Thus, the plasma state below each of the four metal windows 30a to 30d can be monitored. Accordingly, the plasma state below each of the four metal windows 30a to 30d can be monitored in real time. As a result, it is possible to detect temporal changes of the plasma state or variation in the in-plane distribution of the plasma during the plasma process.

The microprocessor 91 corrects the apparatus parameters of the plasma processing apparatus 100 depending on the plasma state (e.g., the plasma electron density Ne, the electron temperature Te, and the like) obtained based on each of the measurement results of the measuring units 82a to 82d. Accordingly, it is possible to adjust the temporal changes of the plasma state or the in-plane distribution of the plasma generated in the processing chamber 5.

Figure 4:
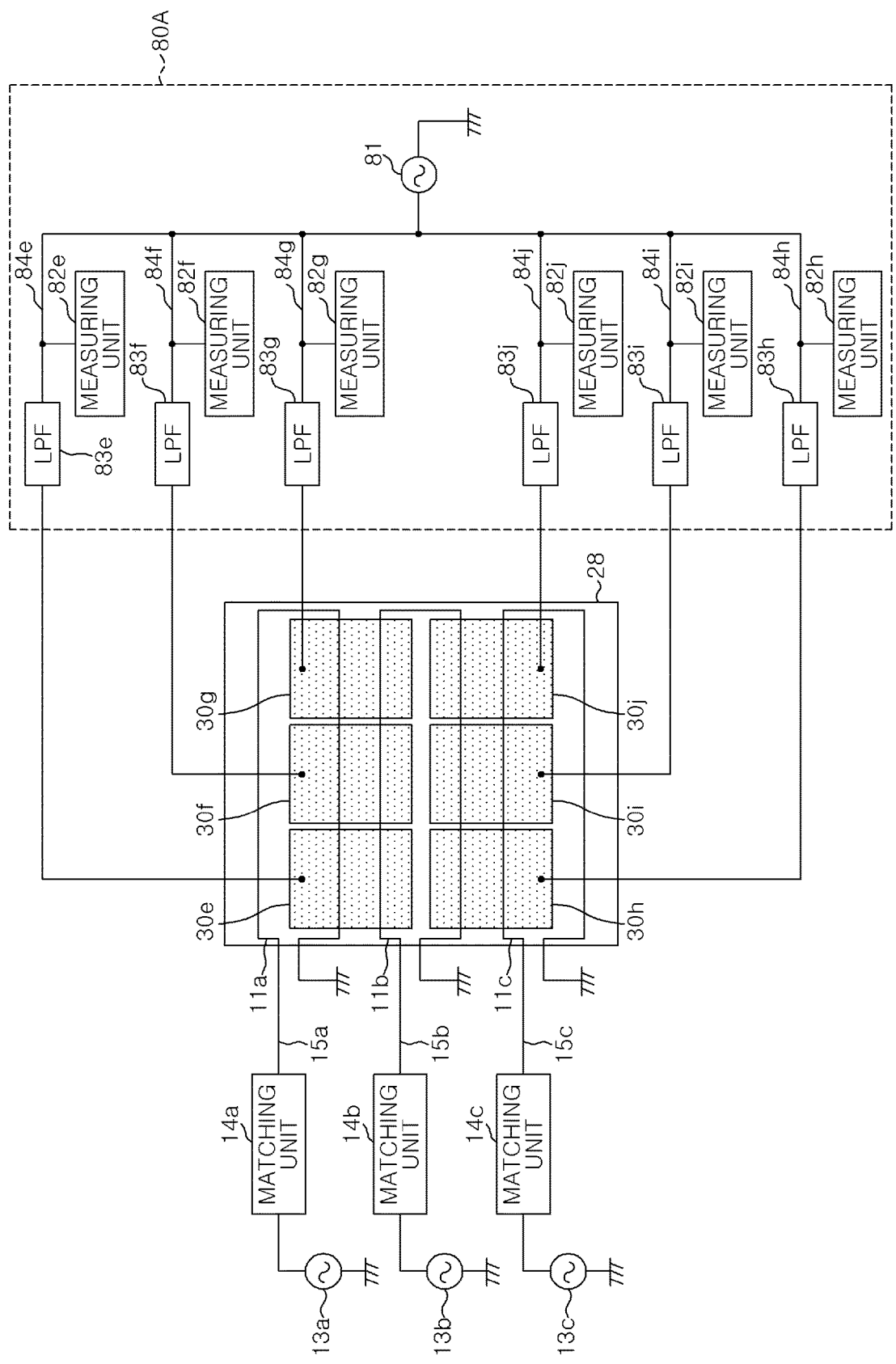
FIG. 4 shows still another example of the plasma processing apparatus.

FIG. 4 shows still another example of the plasma processing apparatus and is a schematic plan view of the radio frequency antenna and the metal windows. The plasma processing apparatus shown in FIG. 4 includes six metal windows 30e to 30j, three radio frequency antennas 11a to 11c, and a plasma detector 80A.

The radio frequency antenna 11a is disposed in the antenna chamber 4 formed above the metal window 3 such that the radio frequency antenna 11a and at least a part of each of the metal windows 30e to 30g are overlapped with each other in a plan view. During the plasma process, a radio frequency power for generating an inductive electric field is applied to the radio frequency antenna 11a from the first radio frequency power supply 13a through the matching unit 14a and the power feed line 15a. By applying the radio frequency power to the radio frequency antenna 11a, eddy currents are induced in the metal windows 30e to 30g and the inductive electric field is generated in a region below the metal windows 30e to 30g in the processing chamber 5 by the eddy currents. Due to the generated inductive electric field, the processing gas supplied through the gas injection holes 8a is turned into plasma in the plasma generation region in the processing chamber 5.

The radio frequency antenna 11b is disposed in the antenna chamber 4 formed above the metal window 3 such that the radio frequency antenna 11b and at least a part of each of the metal windows 30e to 30g and the metal windows 30h to 30j are overlapped with each other in a plan view. During the plasma process, a radio frequency power for generating an inductive electric field is applied to the radio frequency antenna 11b from the first radio frequency power supply 13b through the matching unit 14b and the power feed line 15b. By applying the radio frequency power to the radio frequency antenna 11b, eddy currents are induced in the metal windows 30e to 30g and the metal windows 30h to 30j and the inductive electric field is generated in a region below the metal windows 30e to 30g and the metal windows 30h to 30j in the processing chamber 5 by the eddy currents. Due to the generated inductive electric field, the processing gas supplied through the gas injection holes 8a is turned into plasma in the plasma generation region in the processing chamber 5.

The radio frequency antenna 11c is disposed in the antenna chamber 4 formed above the metal window 3 such that the radio frequency antenna 11c and at least a part of each of the metal windows 30h to 30j are overlapped with each other in a plan view. During the plasma process, a radio frequency power for generating an inductive electric field is applied to the radio frequency antenna 11c from the first radio frequency power supply 13c through the matching unit 14c and the power feed line 15c. By applying the radio frequency power to the radio frequency antenna 11c, eddy currents are induced in the metal windows 30h to 30j and the inductive electric field is generated in a region below the metal windows 30h to 30j in the processing chamber 5 by the eddy currents. Due to the generated inductive electric field, the processing gas supplied through the gas injection holes 8a is turned into plasma in the plasma generation region in the processing chamber 5.

The plasma detector 80A detects the plasma state by measuring each of the currents flowing through the metal windows 30e to 30j when an AC voltage is applied to the metal windows 30e to 30j. Accordingly, the distribution state of the plasma below the six metal windows 30e to 30j can be monitored. Specifically, when the AC voltage is applied from the AC power supply 81 to the metal windows 30e to 30j under the control of the controller 90, the measuring units 82e to 82j respectively measure the currents flowing through the metal windows 30e to 30j during the plasma process via the power feed lines 84e to 84j. The measuring units 82e to 82j respectively transmit signals indicating waveforms of the measured currents to the controller 90. When the signals are received, the microprocessor 91 of the controller 90 obtains the plasma state by Fourier transforming and analyzing each of the waveforms of the currents contained in the signals. Accordingly, the plasma state below each of the six metal windows 30e to 30j can be monitored in real time. As a result, it is possible to detect the temporal changes of the plasma state or the variation in the in-plane distribution of the plasma during the plasma process.

Depending on the plasma state obtained based on each of the measurement results of the measuring units 82e to 82j, the microprocessor 91 controls the radio frequency powers applied to the radio frequency antennas 11a to 11c corresponding to the measuring units 82e to 82j in real time during the plasma process. Specifically, the microprocessor 91 controls the radio frequency powers applied from the first radio frequency power supplies 13a to 13c connected to the corresponding radio frequency antennas 11a to 11c depending on the obtained electron density Ne and the obtained electron temperature Te of the plasma. Accordingly, the distribution state of the plasma generated in the processing chamber 5 can be adjusted.

For example, when the currents flowing through the metal windows 30e to 30g respectively measured by the measuring units 82e to 82g are smaller than the currents flowing through the metal windows 30h to 30j respectively measured by the measuring instruments 82h to 82j, the microprocessor 91 increases the radio frequency power applied to the radio frequency antenna 11a. Alternatively, the microprocessor 91 decreases the radio frequency power applied to the radio frequency antenna 11c.

On the other hand, when the currents flowing through the metal windows 30e to 30g respectively measured by the measuring units 82e to 82g are greater than the currents flowing through the metal windows 30h to 30j respectively measured by the measuring units 82h to 82j, the microprocessor 91 decreases the radio frequency power applied to the radio frequency antenna 11a. Alternatively, the microprocessor 91 increases the radio frequency power applied to the radio frequency antenna 11c.

Although the case where one radio frequency antenna or a plurality of radio frequency antennas are disposed to correspond to a plurality of metal windows has been described in the example of FIG. 4, the present disclosure is not limited thereto. For example, the metal windows and the radio frequency antennas may be disposed in one-to-one correspondence. In this case, the distribution state of the plasma generated in the processing chamber 5 can be adjusted accurately.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A plasma processing apparatus comprising:
a main container;
one or more radio frequency antennas configured to generate inductively coupled plasma in a plasma generation region in the main container by a radio frequency power applied from a first power supply;
a plurality of metal windows disposed between the plasma generation region and the radio frequency antennas while being insulated from each other and from the main container; and
a plasma detector connected to each of the metal windows and configured to detect a plasma state,
wherein the plasma detector detects the plasma state by applying an AC voltage to the metal windows from a second power supply and measuring currents flowing through the metal windows.

2. The plasma processing apparatus of claim 1, further comprising:
a controller configured to control conditions of a plasma process based on the plasma state detected by the plasma detector during the plasma process.

3. The plasma processing apparatus of claim 2, wherein the conditions of the plasma process include a radio frequency power supplied to the radio frequency antennas.

4. The plasma processing apparatus of claim 1, wherein the plasma state includes at least one of an electron density and an electron temperature of the plasma.

5. The plasma processing apparatus of claim 4, further comprising:
a controller configured to control conditions of a plasma process based on the plasma state detected by the plasma detector during the plasma process.

6. The plasma processing apparatus of claim 5, wherein the conditions of the plasma process include a radio frequency power supplied to the radio frequency antennas.

7. The plasma processing apparatus of claim 1, wherein plasma detector measures the plasma state corresponding to each of the metal windows by measuring each of the currents flowing through the metal windows.

8. The plasma processing apparatus of claim 7, wherein the plasma state includes at least one of an electron density and an electron temperature of the plasma.

9. The plasma processing apparatus of claim 7, further comprising:
a controller configured to control conditions of a plasma process based on the plasma state detected by the plasma detector during the plasma process.

10. The plasma processing apparatus of claim 9, wherein the conditions of the plasma process include a radio frequency power supplied to the radio frequency antennas.

11. A control method for controlling plasma using a plasma processing apparatus wherein the plasma processing apparatus includes a main container; one or more radio frequency antennas configured to generate inductively coupled plasma in a plasma generation region in the main container by a radio frequency power applied from a first power supply; a plurality of metal windows disposed between the plasma generation region and the radio frequency antennas while being insulated from each other and from the main container; and a plasma detector connected to each of the metal windows and configured to detect a plasma state, wherein the plasma detector detects the plasma state by measuring each of the currents flowing through the metal windows when an AC voltage is applied to the metal windows by a second power supply, the control method comprising:

controlling conditions of a plasma process based on the plasma state detected by the plasma detector during the plasma process.

* * * * *